(12) United States Patent
Bonamy, Jr.

(10) Patent No.: US 11,383,276 B2
(45) Date of Patent: Jul. 12, 2022

(54) LUMBER USE DESIGNATION SYSTEM AND METHOD

(71) Applicant: RDBJ, LLC, Birmingham, AL (US)

(72) Inventor: R. David Bonamy, Jr., Birmingham, AL (US)

(73) Assignee: RDBJ, LLC, Birmingham, AL (US)

(*) Notice: Subject to any disclaimer, the term of this patent is extended or adjusted under 35 U.S.C. 154(b) by 49 days.

(21) Appl. No.: 17/015,867

(22) Filed: Sep. 9, 2020

(65) Prior Publication Data

US 2021/0078046 A1    Mar. 18, 2021

Related U.S. Application Data

(60) Provisional application No. 62/900,007, filed on Sep. 13, 2019.

(51) Int. Cl.

| | | |
|---|---|---|
| *B07C 5/00* | (2006.01) | |
| *B07C 5/14* | (2006.01) | |
| *E04C 2/12* | (2006.01) | |
| *G06F 30/13* | (2020.01) | |
| *E04G 21/18* | (2006.01) | |
| *G06Q 10/08* | (2012.01) | |
| *G06Q 50/08* | (2012.01) | |
| *E04B 1/94* | (2006.01) | |
| *E04B 2/70* | (2006.01) | |

(52) U.S. Cl.
CPC .......... *B07C 5/14* (2013.01); *E04C 2/12* (2013.01); *E04G 21/1891* (2013.01); *G06F 30/13* (2020.01); *E04B 1/941* (2013.01); *E04B 2/70* (2013.01); *G06Q 10/087* (2013.01); *G06Q 50/08* (2013.01)

(58) Field of Classification Search
None
See application file for complete search history.

(56) References Cited

U.S. PATENT DOCUMENTS

| | | | | |
|---|---|---|---|---|
| 3,217,455 A | * | 11/1965 | Burges | E04C 2/292 52/794.1 |
| 4,392,204 A | * | 7/1983 | Prim | B44B 5/0076 144/329 |
| 4,573,302 A | * | 3/1986 | Caretto | E04B 1/35 52/741.15 |

(Continued)

OTHER PUBLICATIONS

Bock, Thomas, and Thomas Linner. Robotic industrialization. Cambridge University Press, 2015. (Year: 2015).*

(Continued)

*Primary Examiner* — Gurkanwaljit Singh
(74) *Attorney, Agent, or Firm* — Baker Donelson; Carl M. Davis, II; Dorian B. Kennedy

(57) ABSTRACT

A lumber use designation system includes a building construction plan that shows the layout, wall thickness, wall height, ceiling angles, etc., of a structure, which are color coded from a series of color codes each corresponding to a preselected, standard board size and length of lumber that should be selected for constructing a particular portion of the structure. The system includes a supply of lumber boards marked with a color code correlating to the color code found on the construction plans. The lumber boards may be imprinted by an ink spray head. A method of installing lumber during the construction of a structure is disclosed.

13 Claims, 2 Drawing Sheets

(56) References Cited

U.S. PATENT DOCUMENTS

| | | | | |
|---|---|---|---|---|
| 5,074,244 | A * | 12/1991 | Byers | B05B 7/08 |
| | | | | 118/712 |
| 5,755,072 | A | 5/1998 | Lingafelter | |
| 6,510,364 | B2 * | 1/2003 | Ahrens | B65G 61/00 |
| | | | | 198/418.2 |
| 6,681,140 | B1 * | 1/2004 | Heil | G05B 19/4097 |
| | | | | 700/95 |
| 7,181,887 | B1 * | 2/2007 | Baij | E04G 21/1891 |
| | | | | 52/243 |
| 9,147,014 | B2 * | 9/2015 | Lastra | G01N 21/8986 |
| 10,723,163 | B2 * | 7/2020 | Homeier | B27D 5/003 |
| 11,110,732 | B2 * | 9/2021 | Mercier | B41J 3/4073 |
| 2005/0069698 | A1 * | 3/2005 | Eubanks | B44C 1/10 |
| | | | | 428/354 |
| 2005/0120840 | A1 * | 6/2005 | Koskovich | B27B 31/06 |
| | | | | 83/72 |
| 2007/0141318 | A1 * | 6/2007 | Balthes | B32B 27/32 |
| | | | | 442/302 |
| 2008/0010910 | A1 * | 1/2008 | Baij | E04B 2/706 |
| | | | | 52/105 |
| 2015/0050465 | A1 | 2/2015 | Hennessee | |
| 2015/0153724 | A1 * | 6/2015 | Platt | G06Q 30/0621 |
| | | | | 700/98 |
| 2019/0172160 | A1 * | 6/2019 | Conboy | B27K 3/20 |
| 2020/0246999 | A1 * | 8/2020 | Jin | B23D 59/001 |
| 2020/0340231 | A1 * | 10/2020 | Baughey | E04B 1/185 |
| 2021/0187783 | A1 * | 6/2021 | Bellissimo | B27M 3/04 |

OTHER PUBLICATIONS

Patent Cooperation Treaty, International Preliminary Report on Patentability (dated Oct. 5, 2021).

Patent Cooperation Treaty, International Search Report, PCT/US20/49951 (dated Nov. 20, 2020).

Patent Cooperation Treaty, Written Opinion, PCT/US20/49951 (dated Nov. 20, 2020).

Regj, Inc., Patent Cooperation Treaty, Article 34 Letter, PCT/US20/49951 (dated Jul. 8, 2021).

* cited by examiner

LUMBER USE DESIGNATION SYSTEM AND METHOD

CROSS REFERENCE TO RELATED APPLICATIONS

This application claims the benefit of U.S. Provisional Patent Application No. 62/900,007 filed Sep. 13, 2019, entitled "Lumber Use Designation System", and is incorporated herein by reference.

STATEMENT REGARDING FEDERALLY SPONSORED RESEARCH OR DEVELOPMENT

Not applicable.

TECHNICAL FIELD

This invention relates to a system for efficiently selecting and utilizing lumber during the building process. More particularly, the present invention relates the designation and use of lumber to decrease waste.

BACKGROUND OF THE INVENTION

Wood boards or lumber has been utilized for the building of physical structures for centuries. Today, lumber is available in many different sizes, such as 2"×4", 4"×4", 2"×6", etc. These standard sized boards or lumber also come in a variety of standard longitudinal lengths, such as 8', 10', 12', and 14' lengths.

Prior to the construction process, construction plans or blueprints are made to show the height and location of each wall of the structure. During the construction process, carpenters follow these construction plans when forming the building walls, floor joists, ceiling joists, supports, rooflines, and other similar parts of the structure.

A problem commonly associated with the construction process relates to the large amount of lumber that is wasted during construction. One of the largest contributors to the generation of lumber waste stems from the fact that carpenters oftentimes utilize the first board he or she finds which is capable of completing the task, rather than taking the time and effort to find the best available appropriate board for the task. For example, if a construction plan calls for a 9 foot vertical wall, the carpenter may simply utilize the closest available board, even if that board is a 14 foot board. The carpenter then cuts the 14 foot board to 9 feet, resulting in the generation of 5 feet of board waste. This board waste however could have been reduced to only 1 foot of waste by the carpenter simply selecting a shorter 10 foot board rather than the longer 14 foot board. It is believed that a contributing factor to the generation of waste is due to the fact that once a board is in place, the original length of the board cannot be determined by a supervisor, as boards are typically marked only at the very end of the board. As such, there is no accountability on the part of the carpenter installing the boards as to the selection of the best fitting board.

Accordingly, there is a need in the art for an improved system of installing lumber to reduce the amount of wasted lumber during construction. It is to such that the present invention is directed.

SUMMARY OF THE INVENTION

The present invention meets the need in the art by providing a lumber use designation system that comprises a building construction plan illustrating a respective position of each of a plurality of building walls, each building wall displayed in a respective board code to indicate one of a plurality of board lengths of lumber, wherein said respective board code designating a specific board length of lumber, said respective board code designating the board length of lumber for use in constructing the respective coded building wall, said board code comprising a respective one of a plurality of colors; and a supply of lumber of the plurality of board lengths, each of the plurality of board lengths having one or more lumber each having a board marking thereon that correspond with said board code said respective board length, said one or more lumber selectable for building the respective wall illustrated on said construction plan in the board coding, whereby the selected lumber of the respective board coding corresponds to the respective coded building wall in length or is cut shorter to length for constructing said respective building wall.

In another aspect, the present invention provides a method of installing lumber during the construction of a structure, comprising the steps of (a) producing a construction plan illustrating a respective position of a plurality of structure walls, each of the plurality of the illustrated structure walls including a respective board code of a series of board codes that indicate a respective length of lumber board to be used during the construction of a respective one of the plurality of the structure walls having said board code for the structure, wherein said board code designating a specific board length, said board code comprising a respective one of a plurality of colors; (b) marking a plurality of lumber boards with a respective one of the plurality of board markings corresponding to the board codes of said building construction plan in accordance with a respective length of the lumber board for use in constructing a respective one of the structure walls; (c) selecting the lumber boards to be installed during the construction of a respective one of the plurality of structure walls by referencing the construction plan board code for said respective structure wall of the structure, whereby a one of the lumber boards having the designated board code corresponding to the board code illustrated on the construction plan for the respective structure wall is selected, and (d) installing the selected lumber board or cutting the selected lumber board to length and installing said cut selected lumber board to form said respective structure wall of the structure.

Objects, advantages and features of the present invention will be readily understood upon a reading of the following detailed description in conjunction with the drawings.

DETAILED DESCRIPTION

Figure 1:
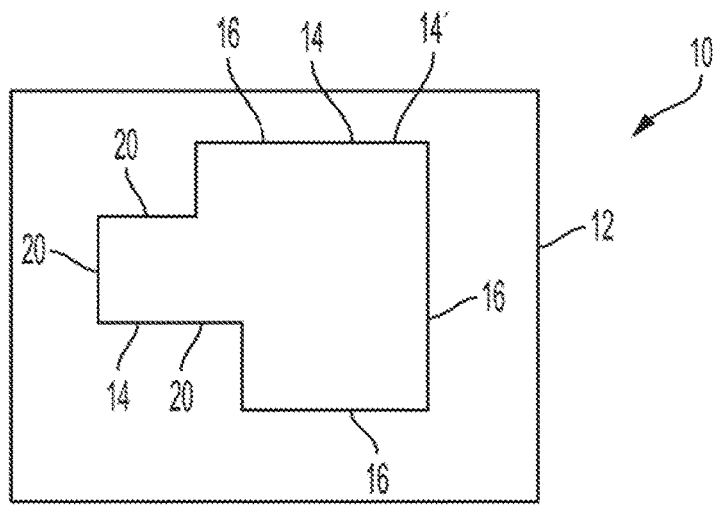
FIG. 1 shows a construction plan as an illustrative application of the lumber use designation system of the present invention.

With reference next to the drawings, there is shown a lumber use designation system 10 as an illustrative application of the present invention. The system 10 includes a building construction plan or blueprint 12 which shows the layout, wall thickness, wall height, ceiling angles, etc., associated with a particular structure. The construction plan 12 illustrates or shows the location of building walls 14, and other structure specifications, which are color coded from a series of color codes. Each color in the series of color codes corresponds to a preselected, standard board size and length of lumber (type of board) that should be selected for constructing a correlated particular vertical wall structure or area of the wall. For example, the construction plan 12 may illustrate green walls 16 (green color board coded walls) to designate the use of green color coded or marked boards 18 for the construction of these walls 16, wherein the color green represents 2" by 4" (depth and width) boards having a longitudinal length of 10 feet. The construction plan 12 may have blue walls 20 (blue color board coded walls) to designate the use of blue color coded boards 22 used for the construction of these walls 20, wherein the color blue represents 2" by 4" boards having a longitudinal length of 12 feet. The construction plans may be board coded in a variety of manners which are easily printed upon the actual lumber boards, such as color codes, hash-markings, stripe-markings, alpha-numeric markings, or the like. However, it is believed that the color coding provides the best manner of marking a board as it is easy to recognize, is not language dependent, and stands out from other markings which may also appear on lumber, such as the manufacturer's name, batch number, etc.

Figure 2:
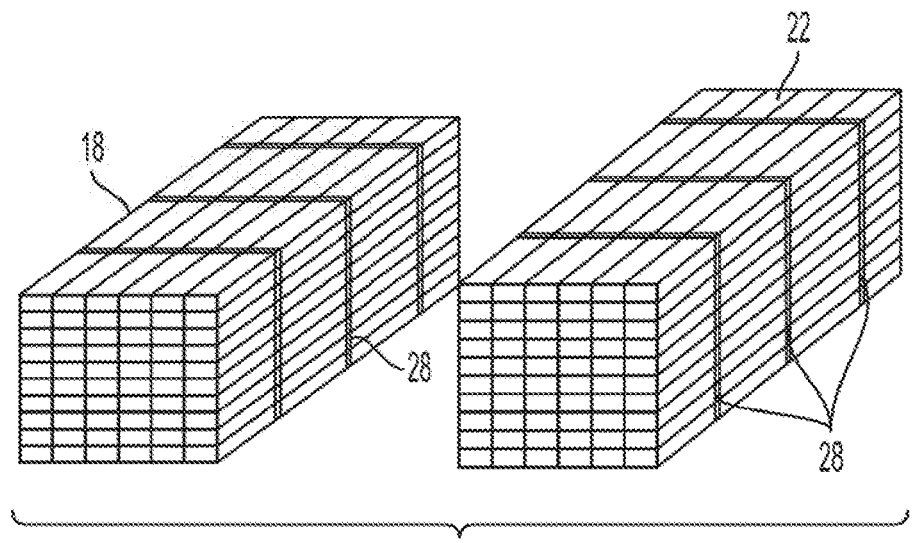
FIG. 2 shows two stacks of lumber of the lumber use designation system of the present invention.
Figure 3:
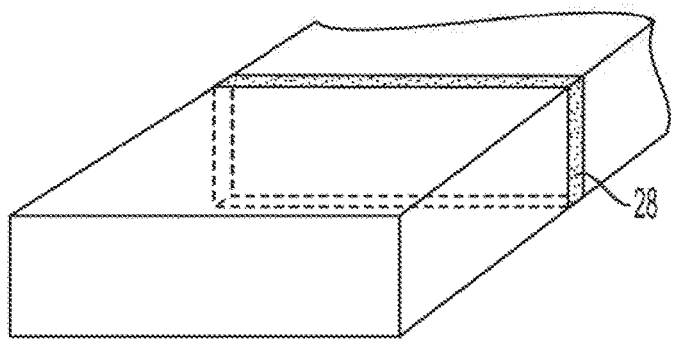
FIG. 3 shows a single board of lumber of the lumber use designation system of FIG. 2.

The system 10 also includes a plurality of lumber boards that are imprinted or marked with a color code or coding correlating to the color code or coding found on the construction plans 12. FIG. 2 shows a first stack of lumber boards (first boards) 18 which have been imprinted with a first color coding, for example the color green. The first boards 18 have a longitudinal length of 10 feet. There is also shown a second stack of lumber boards (second boards) 22 which have been imprinted with a second color coding, for example the color blue. The second boards 22 have a longitudinal length of 12 feet.

The lumber boards may be imprinted with color coding in any conventional manner, such as by a conventional liquid spray head, liquid roller, of other device during or post manufacturing. The boards are printed with any conventional known marking media, such as an ink or paint, or may be marked by embossing, cutting into, etching, engraving or other manner of slightly disfiguring the surface of the board. Preferably, the boards are imprinted with several, spaced apart color coded strips 28 aligning in a lateral direction and completely surrounding each board, so that the mark may be observed with the board mounted in any position or orientation. Also, each board is marked in several locations to prevent the color coded stripe 28 from being lost due a portion of the board being cut off due to the board being shortened to a proper installation length.

Figure 6:
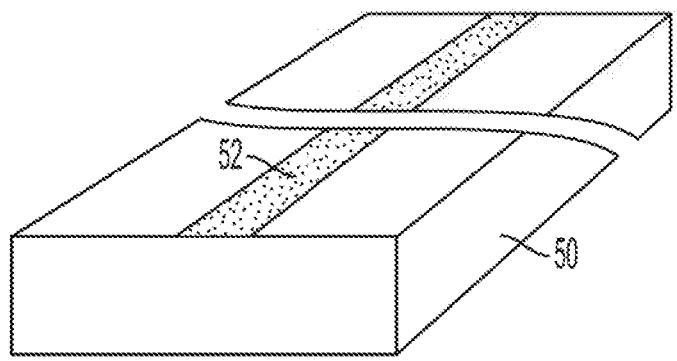
FIG. 6 shows a single board of lumber of the lumber use designation system of the present invention.

Alternatively as illustrated in FIG. 6, the boards 50 may be marked with one or more longitudinally extending color coding stripes 52 extending the entire length of the board. Such a longitudinal stripe 52 would ensure that the board 50 contains the color stripe size designation no matter where the board is cut to length.

Figure 4:
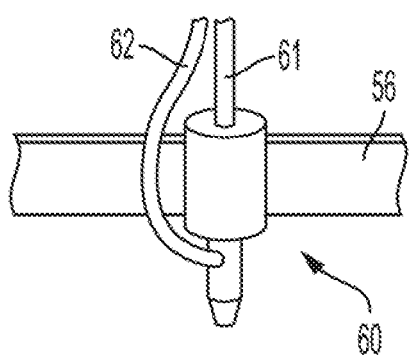
FIG. 4 is a schematic view of a paint head for the lumber use designation system of the present invention.
Figure 5:
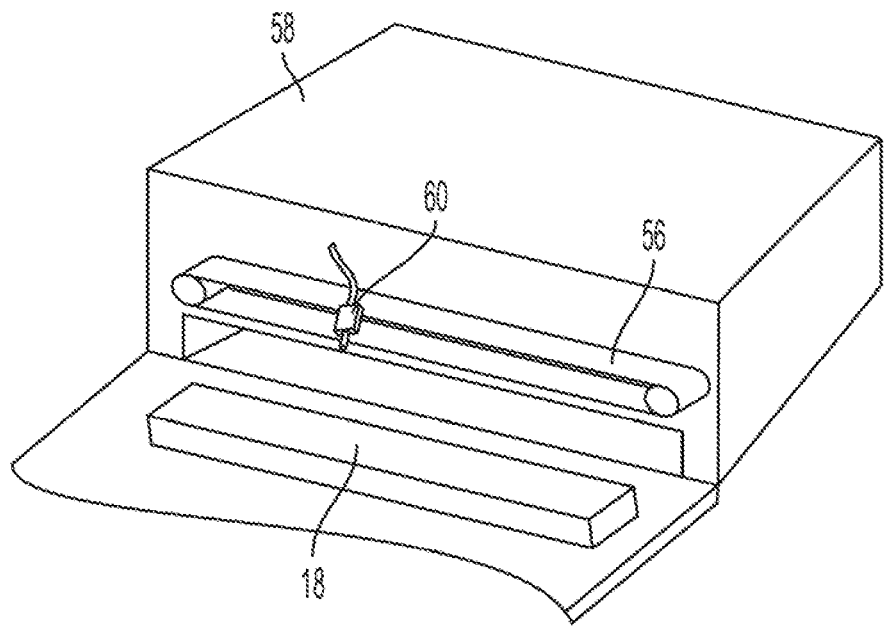
FIG. 5 is a schematic view of a lumber planar and paint head system for the lumber use designation system of the present invention.

The board may be marked with the longitudinal stripe 52 by mounting a reciprocating belt 56 upon the exit end of a final board planar 58 which planes or finishes the board, as shown in FIG. 5. A multi-head paint sprayer 60 is coupled to the reciprocating belt 56. The multi-head paint sprayer 60 may include a paint supply line 61 and a pneumatic air or pressure line 62, as shown in FIG. 4. The paint sprayer 60 is coupled to a supply of paint or dye which is applied to the board in a manner that will not bleed onto other boards. Alternatively, the paint sprayer 60 may include multiple heads to spray different colors, a system to switch between one color and another color, or may simply require a different color paint to be introduced into the paint sprayer 60 when switching between colors. The reciprocating or back and forth action of the belt 56 produces the elongated stripe 52 upon the board 50. The operation of the paint spraying may be accomplished through sensors which sense the position of the board upon exiting the board planar 58.

With reference to FIG. 1, in use of the system 10, the construction plans 12 are produced to include walls 14, or possibly other portions, that are color coded to reflect the length of board to be utilized during the construction process. Lumber or boards (for example, boards 18, 22) in accordance with the system 10 and construction plans 12 are delivered to the job site with the color coding that correlates with the construction plans 12.

A carpenter constructing the structure according to the plans 12 simply follows the system's color coding during the construction process. For example, when the time comes to build wall 14' shown on construction plan 12, the carpenter notes that the plans 12 reflect that this is a green wall 16, i.e., the wall 14' is color coded with the color green. The carpenter then selects one of the available green color coded boards 18, measures, and possibly cuts the board to the proper length. This color coding encourages the carpenter to use the proper preselected board length rather than cutting an unnecessarily longer (12 foot) blue color coded boards 22, which would be readily seen in an installed position by a supervisor as an error and a waste of lumber. As such, the green walls 16 of the construction plan 12 are constructed with green color coded boards 18, while the blue walls 20 are constructed with blue color coded boards 22.

While only two colors have been shown in the present example, it should be understood that any number of colors or other markings may be utilized to designed different lengths or sizes of boards. For example, while the previously described green and blue colors may be utilized for 2"×4" boards, a different colors may be utilized for 2"×6" sized boards of preselected lengths.

The distinct advantage to the invention described in the embodiment herein is that the color coding provides a post-installation inspection of the proper selection of board lengths during the construction process. Thus, there is a method of making the carpenter accountable for utilizing the most efficient board available, rather than simply the closest or first found board.

Another distinct advantage to the invention is that the color coding reduces the time and effort necessary to determine and locate the proper board for the task, as a size and length are previously determined and shown on the construction plans, and the color marking on the board is immediately recognizable from afar and eliminates the need to actually measure the board to determine if it is the best fit.

It is believed that with the standard color coding of all lumber, the amount of lumber waste could be greatly reduced.

It should be understood that as used herein, the term lumber or board includes boards made of any material, such as wood, metal, a composite, a laminate, or similar materials.

This invention has been described with particular reference to certain illustrative embodiments, but variations and modifications can be made without departing from the spirit and scope of the invention. Variations of the lumber use designation system may fall within the spirit of the claims, below. It will be appreciated that the inventions are susceptible to modification, variation, and change without departing from the spirit thereof

What is claimed is:

1. A lumber use designation system comprising:
   a building construction plan illustrating a respective position of each of a plurality of building walls, each building wall displayed in a respective board code to indicate one of a plurality of board lengths of lumber, wherein said respective board code designating a specific board length of lumber, said respective board code designating the board length of lumber for use in constructing the respective coded building wall, said board code comprising a respective one of a plurality of colors; and
   a supply of lumber of the plurality of board lengths, each of the plurality of board lengths having one or more lumber each having a board marking thereon that corresponds with said board code of said respective board length, said one or more lumber selectable for building the respective building wall illustrated on said construction plan in the board coding, whereby the selected lumber of the respective board coding corresponds to the respective coded building wall in length or is cut shorter to length for constructing said respective building wall.

2. The lumber use designation system of claim 1, wherein said board marking is a plurality of laterally extending stripes.

3. The lumber use designation system of claim 1, wherein said board marking is at least one longitudinally extending stripe.

4. The lumber use designation system of claim 1, wherein said board code further designates a specific board width and depth.

5. A method of installing lumber during the construction of a structure, the method comprising the steps of:
   (a) producing a construction plan illustrating a respective position of a plurality of structure walls, each of the plurality of the illustrated structure walls including a respective board code of a series of board codes that indicate a respective length of lumber board to be used during the construction of a respective one of the plurality of structure walls having said board code for the structure, wherein said board code designating a specific board length, said board code comprising a respective one of a plurality of colors;
   (b) marking a plurality of lumber boards with a respective one of the plurality of board markings corresponding to the board codes of said building construction plan in accordance with a respective length of the lumber board for use in constructing a respective one of the structure walls;
   (c) selecting the lumber boards to be installed during the construction of a respective one of the plurality of structure walls by referencing the construction plan board code for said respective structure wall of the structure, whereby a one of the lumber boards having the designated board code corresponding to the board code illustrated on the construction plan for the respective structure wall is selected, and
   (d) installing the selected lumber board or cutting the selected lumber board to length and installing said cut selected lumber board to form said respective structure wall of the structure.

6. The method of installing lumber of claim 5, wherein step (A) the construction plans board code is a color code, and wherein step (B) the lumber boards board markings are a color code.

7. The method of installing lumber of claim 6, wherein step (B) the lumber boards are marked with a series of lateral color coded stripes.

8. The method of installing lumber of claim 6, wherein step (B) the lumber boards are marked with at least one longitudinal color coded stripe.

9. The lumber use designation system of claim 1, further comprising a paint sprayer for communicating with a supply of paint of each of the plurality of colors, said paint sprayer positioned relative to a lumber planer device configured for exiting lumber therefrom; and a switch system for selecting a respective one of the plurality of colors for spraying the board code on the respective length of lumber associated with the board code, whereby lumber exiting a board planer is marked by the paint sprayer with the respective board code.

10. The lumber use designation system of claim 9, further comprising a reciprocating belt to which the paint sprayer attaches, whereby the reciprocating belt moves the paint sprayer during spraying operation to apply the respective color to the exited lumber.

11. The method of installing lumber of claim 5, further comprising the step of:
   providing a paint sprayer for communicating with a supply of paint of each of the plurality of colors; and
   selecting with a switch system one of the plurality of colors for spraying the board code on the respective lumber associated with the board code,
   whereby lumber exiting a board planer is marked with the respective board code.

12. The method of installing lumber of claim 11, further comprising the step of positioning said paint sprayer relative to a lumber planer device configured for exiting lumber therefrom, whereby lumber exiting the lumber planer is marked by the paint sprayer with the respective board code.

13. The method of installing lumber of claim 11, further comprising the step of attaching the paint sprayer to a reciprocating belt, whereby the reciprocating belt moves the paint sprayer during spraying operation to apply the respective color to the exited lumber.

* * * * *